(12) United States Patent
Basteres et al.

(10) Patent No.: US 6,548,365 B2
(45) Date of Patent: Apr. 15, 2003

(54) MONOLITHIC INTEGRATED CIRCUIT INCORPORATING AN INDUCTIVE COMPONENT AND PROCESS FOR FABRICATING SUCH AN INTEGRATED CIRCUIT

(75) Inventors: Laurent Basteres, Grenoble (FR); Ahmed Mhani, Grenoble (FR); François Valentin, Veurey Voroize (FR); Jean-Michel Karam, Grenoble (FR)

(73) Assignee: Memscap S.A. and Planhead-Silmag PHS, S.A. (FR)

( * ) Notice: Subject to any disclaimer, the term of this patent is extended or adjusted under 35 U.S.C. 154(b) by 0 days.

(21) Appl. No.: 10/177,435

(22) Filed: Jun. 21, 2002

(65) Prior Publication Data

US 2002/0160576 A1 Oct. 31, 2002

Related U.S. Application Data

(62) Division of application No. 09/525,840, filed on Mar. 15, 2000, now Pat. No. 6,459,135.

(30) Foreign Application Priority Data

Mar. 23, 1999 (FR) ............................................ 99 03762

(51) Int. Cl.[7] .............................................. H01L 21/20
(52) U.S. Cl. ..................................................... 438/381
(58) Field of Search ............................... 257/528, 531; 336/12, 65, 107, 138, 173, 186, 223, 225; 438/329, 381, 643, 648, 653

(56) References Cited

U.S. PATENT DOCUMENTS

| | | | | |
|---|---|---|---|---|
| 5,070,317 A | * | 12/1991 | Bhagat | |
| 5,384,274 A | * | 1/1995 | Kanchachi | |
| 5,446,311 A | * | 8/1995 | Ewen et al. | 257/531 |
| 5,478,773 A | * | 12/1995 | Dow et al. | 438/381 |
| 5,834,825 A | * | 11/1998 | Imai | |
| 5,874,883 A | * | 2/1999 | Uemura et al. | |

FOREIGN PATENT DOCUMENTS

| | | | |
|---|---|---|---|
| EP | 0 782 190 | * | 11/1996 |
| JP | 08 116031 | * | 10/1994 |
| JP | 08 172161 | * | 12/1994 |
| JP | 09 063847 | * | 8/1995 |
| JP | 09 186018 | * | 6/1996 |

OTHER PUBLICATIONS

V. Maliba et al., "High performance RF Coil Inductors on Silicon," Electronic Components and Technology Conference, 1998 pp 252–255.*

* cited by examiner

Primary Examiner—Kamand Cuneo
Assistant Examiner—Asok Kumar Sarkar
(74) Attorney, Agent, or Firm—Wall Marjama & Bilinski LLP

(57) ABSTRACT

A monolithic integrated circuit (1) incorporating an inductive component (2) and comprising:

a semiconductor substrate layer (2);

a passivation layer (4) covering the substrate layer (2);

metal contact pads (5) connected to the substrate (2) and passing through the passivation layer (4) in order to be flush with the upper face (6) of the passivation layer (4);

which circuit also includes a spiral winding (20) which forms an inductor and lies in a plane parallel to the upper face (6) of the passivation layer (4), said winding (20) consisting of copper turns (21–23, 27, 28) having a thickness of greater than 10 microns, the winding ends forming extensions (12) which extend below the plane of the winding (20) and are connected to the contact pads (5).

6 Claims, 8 Drawing Sheets

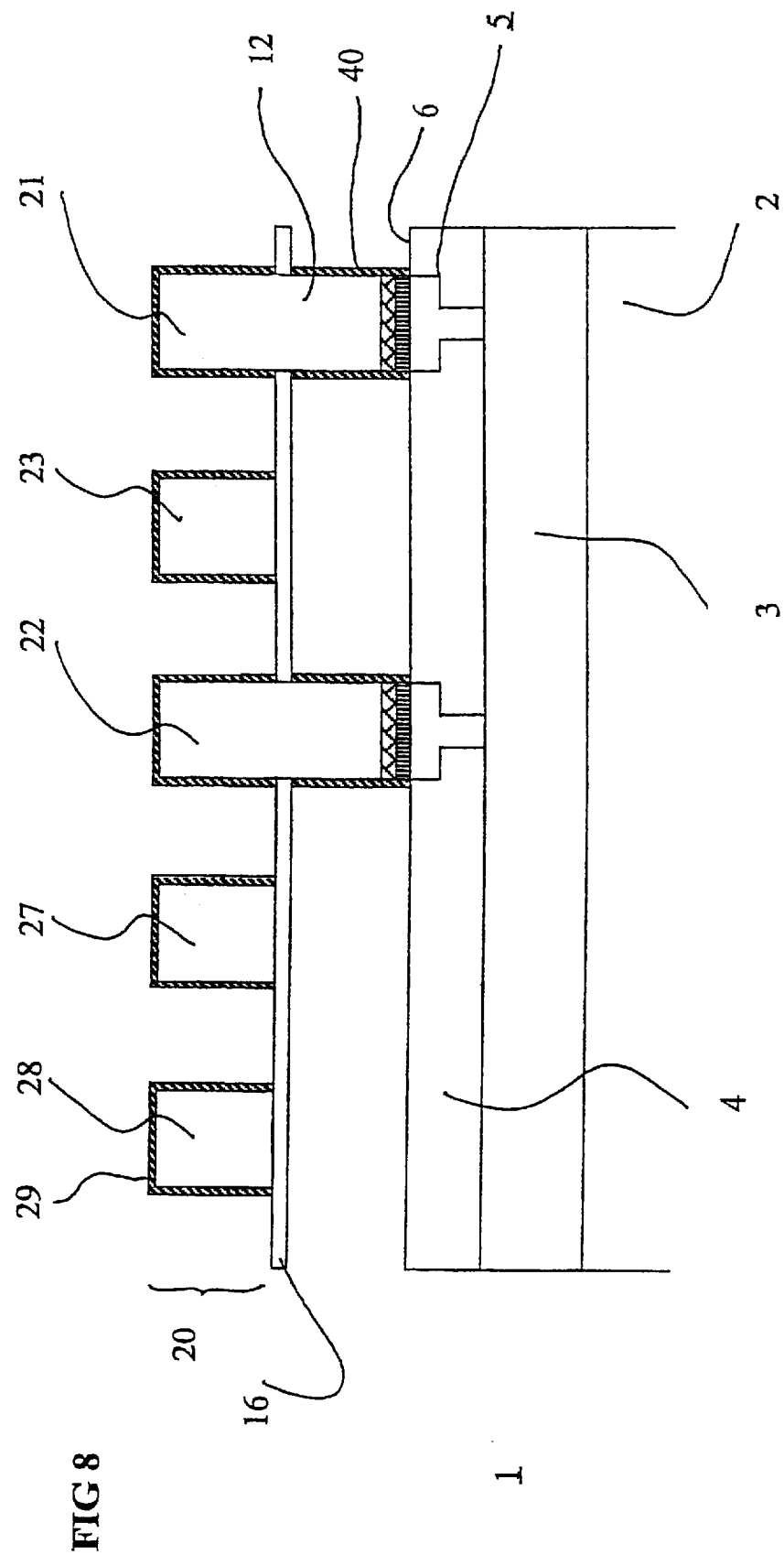

MONOLITHIC INTEGRATED CIRCUIT INCORPORATING AN INDUCTIVE COMPONENT AND PROCESS FOR FABRICATING SUCH AN INTEGRATED CIRCUIT

CROSS REFERENCE TO RELATED APPLICATION

This is a divisional application of U.S. Ser. No. 09/525,840, filed Mar. 15, 2000, now U.S. Pat No. 6,459,135 now allowed, the entirety of which is incorporated herein by reference.

FIELD OF THE INVENTION

The invention relates to the field of microelectronics. More specifically, it relates to monolithic integrated circuits which include inductive components such as those used especially for applications in radiofrequency telecommunications.

It also relates to a process for fabricating such components, which makes it possible to obtain compact circuits having electrical characteristics, and especially a Q-factor, which are superior to those of existing components.

PRIOR ART

As is known, integrated circuits are being used more and more in microwave and radiofrequency techniques.

In these applications, it is important to be able to use tuned oscillating circuits consisting of a capacitor-inductor combination.

Now, such circuits must be produced so as to occupy smaller and smaller volumes. Furthermore, they must operate at higher and higher frequencies. Consequently, the electrical consumption of such components becomes a critical parameter, for example in cellular portable telephones, since the consumption has a direct influence on the autonomy of these appliances.

Thus, it is required that the passive components constituting the filters used in radiofrequency systems, and especially the inductors, occupy as small an area as possible within the integrated circuits, have as high an inductance as possible and as low an electrical consumption as possible.

Furthermore, it is known that the inductors incorporated into integrated circuits made of semiconductor material are exposed to the influence of parasitic capacitances formed by the various localized substrate regions near the inductors.

Thus, in practice, an inductor has an equivalent circuit in which various parasitic components are added to this inductance proper, these parasitic components causing this inductor to depart from its ideal performance.

Thus, a real inductor has a resistance corresponding to that of the metal of which it is composed.

Furthermore, the electrical behavior of the inductor is disturbed by parasitic capacitances which result from various layers, located above the substrate, of materials of poor electrical permittivity.

Furthermore, added to the parasitic capacitances of these various layers are a capacitance and a parasitic resistance corresponding to the influence of the semiconductor substrate located above the ground plane.

Furthermore, a parasitic capacitance exists between the various turns making up the inductor.

In document EP-0,969,509, the Applicant has described a solution making it possible to produce such inductors on a semiconductor substrate, by adopting an arrangement allowing the value of the parasitic capacitance existing between turns to be greatly reduced. Such a solution consists in producing the inductor by means of a metal strip deposited on the substrate, in etching said substrate in order to make a cavity beneath the strip forming the inductor and thus in suspending and distancing the inductor from the substrate.

By virtue of these arrangements, it is possible to use inductors at higher frequencies while still maintaining satisfactory behavior. It will be recalled that the optimum operating frequency is determined as being that at which the Q-factor is a maximum. The Q-factor is determined in a known way by the ratio of the imaginary part, or reactance, of the input impedance of an inductor to the real part thereof.

The solution described in the aforementioned document, although satisfactory, does not make it possible to significantly improve the Q-factor in the low-frequency ranges, that is to say ranges below half the optimum frequency which, in the typical applications of the invention, is close to a few gigahertz.

This is because, in this frequency range, the behavior of the inductor is strongly dependent on the value of the equivalent resistance, which corresponds to the electrical resistance of the metal strip making up the actual inductor.

Now, all inductors produced in integrated circuits are at the present time made of aluminum and small in size, especially having a very small thickness, typically less than 4 microns, thereby resulting in a high electrical resistance.

Thus, one of the problems that the invention aims to solve is that of the undesirable influence of the overall resistance of the winding forming the inductor, while still maintaining advantageous electrical characteristics, especially in terms of parasitic capacitance.

Many documents, such as especially documents U.S. Pat. No. 5,874,883, EP 0,782,190 or U.S. Pat. No. 5,834,825, describe integrated circuits which include on their surface inductors consisting of a metal strip. These devices have the aforementioned advantages relating to a low Q-factor when the metal strip is of conventional thickness, of the order of a few microns. Furthermore, these inductors are produced during the process for fabricating the actual integrated circuit, thereby increasing the technological constraints since their incorporation must be taken into account in the steps of the process. Finally, and above all, such inductors occupy a certain area on the semiconductor substrate. This area used by the inductor therefore cannot be used for implanting active regions in the semiconductor, which in turn reduces the useful density of the latter.

In document U.S. Pat. No. 5,478,773, it has been proposed to produce an inductor on a substrate by forming a copper strip by etching a copper layer. Unfortunately, in order to form the turns of the inductor it is necessary to firstly deposit a growth layer of sputtered copper and then to deposit a second layer of electrolytic copper. Next, a differential etching operation is carried out which preferentially etches the sputtered copper compared with the electrolytic copper. This differential etching is necessary in order not to damage the electrolytic copper parts which form the turns. Such operating precautions complicate the process and do not allow turns which are of a sufficient size to markedly improve the Q-factor to be obtained.

SUMMARY OF THE INVENTION

The invention therefore relates to a monolithic integrated circuit incorporating an inductive component and comprising:

a semiconductor substrate layer;

a passivation layer covering the substrate layer;

metal contact pads connected to the substrate and passing through the passivation layer in order to be flush with the upper face of the layer.

This integrated circuit is distinguished in that it also includes a spiral winding which forms an inductor and lies in a plane parallel to the upper face of the passivation layer, said winding consisting of copper turns having a thickness of greater than 10 microns, the winding ends forming extensions extending below the plane of the winding and being connected to the contact pads.

In other words, the inductor is mounted directly on the integrated circuit above the passivation layer. It is formed just after the process for producing the integrated circuit itself. It is therefore possible to create it on wafers from a very wide variety of sources, since its production is independent of the operations for fabricating the actual integrated circuit.

Such an inductor lies above the integrated circuit and not on the integrated circuit, so that the area of the integrated circuit located vertically below the inductor may include active regions in addition to the contact pads. The density of functions on the integrated circuit is therefore not decreased by the presence of the inductor.

The use of copper for producing the winding makes it possible to greatly reduce the equivalent resistance of the inductor. This reduction is made even greater by using turns having a thickness substantially greater than that of the metal strips currently used.

Consequently, the equivalent resistance is very greatly reduced, typically by a factor of ten, compared with the resistance of inductors produced at the present time in integrated circuits.

It follows that the Q-factor is very significantly greater than that of the inductors currently existing, especially at and above low frequencies.

Typically, the Q-factor of such coils is greater than the Q-factor of existing inductors by a factor of approximately ten.

In practice, the plane in which the inductor lies is advantageously away from the upper face of the passivation layer by a distance of more than 10 microns.

The reason for this is that it has been found to be important for the actual inductor to be sufficiently remote from the substrate to limit the phenomena of electrical losses within the substrate, which losses are observed at the operating frequencies of the circuits according to the invention. This distance must nevertheless not be too great, for fear of mechanically destabilizing the inductor.

Thus, for a distance greater than 10 microns, and preferably close to 30 microns, the electrical losses in the substrate are limited, while still ensuring good mechanical stability.

In a first embodiment of the invention, the component comprises a support layer made of benzocyclobutene on which the winding forming the inductor rests. Consequently, the inductor is mechanically stabilized on the support layer, thereby preventing the various turns of the inductor from vibrating against each other and ensuring good mechanical rigidity.

In a second embodiment of the invention, the support layer on which the winding forming the inductor rests is made of silica. According to two versions of the embodiment, the silica support layer is separated from the upper face of the passivation layer:

either by a layer of polyimide, or any other dielectric polymer;

or by a layer of air.

In the latter version of the embodiment, the electrical properties are optimized since the electrical permittivity of air is less than that of the polyimide.

According to another characteristic of the invention, the copper winding may be covered with a layer of gold or of a gold-based alloy, intended to passivate the copper and to prevent the copper oxidation phenomena which would degrade the electrical resistance characteristics, especially if the integrated circuit is used in wet, or even chemically aggressive, atmospheres.

According to another characteristic of the invention, the space between two consecutive turns of the winding is devoid of material, or more specifically filled with air, thereby greatly reducing the parasitic capacitance existing between each turn and therefore increasing the optimum operating frequency of the inductor.

As already stated, the invention also relates to a process for fabricating a monolithic integrated circuit incorporating an inductive component. Thus, starting with a semiconductor substrate covered with a passivation layer and comprising metal pads connected to the substrate, and passing through the passivation layer in order to be flush with the upper surface of said layer, the process according to the invention is distinguished in that it comprises the following steps in which:

a polyimide layer is deposited on the passivation layer;

a silica layer is deposited on said polyimide layer;

apertures are made in the silica and polyimide layers, said apertures emerging at the metal pads;

a metal growth sublayer is deposited on the assembly;

a layer of photosensitive resin is deposited on the metal growth sublayer;

the resin is exposed and the regions intended to form the lower face of the inductive component are removed;

a copper layer intended to form the strip of the inductive component is electrolytically deposited on the visible regions of the metal growth sublayer;

the rest of the photosensitive resin and the metal growth sublayer are removed.

In other words, the process according to the invention makes it possible to produce, directly on the integrated circuit, the inductors necessary for good operation of the circuit, after the process for fabricating the integrated circuit proper.

Consequently, the windings of the inductors are all produced simultaneously, during a series of steps constituting a continuation of the process for fabricating the integrated circuit itself. It is therefore unnecessary to make use of subsequent transfer operations which would consist in connecting inductors produced elsewhere on a finished integrated circuit.

According to one embodiment, the process includes an additional step of removing the polyimide layer, resulting in a component whose inductor is suspended above the passivation layer.

Of course, the invention also covers the process in which the polyimide layer is retained, especially in order to ensure stability of the inductor.

According to one embodiment, both the polyimide and silica layers are replaced by a single layer of benzocyclobutene, or any other equivalent material having a very low dielectric constant.

As already stated, the process may also include a step of passivating the copper strip by depositing a layer of gold or a gold-based alloy. Nevertheless, in a less perfected implementation of the process, provision may be made to cover the turns with a simple conventional passivation layer.

In practice, the process may advantageously include a step of depositing a metal forming a barrier layer on the metal pad. This eliminates the phenomena of copper migration into the aluminum, it being known that such phenomena can cause degradation of the active layer of the semiconductor substrate.

Advantageously, the process includes, after the step of depositing the barrier layer, a step of depositing a matching layer on the barrier metal layer. This step makes it possible to optimize the contact and promotes intermetallic adhesion, while limiting the parasitic capacitances appearing at the metal junctions.

DESCRIPTION OF THE DRAWINGS

The manner in which the invention may be realized and the advantages which stem therefrom will become clearly apparent from the description of the embodiments which follow, these being supported by the appended figures in which:

FIGS. 7 and 8 are two identical sectional views illustrating two different alternative methods of implementing the process according to the invention.

MANNER OF REALIZING THE INVENTION

As already stated, the invention relates to an inductive component, such as a coil or a transformer, incorporated into a monolithic integrated circuit.

Figure 1:
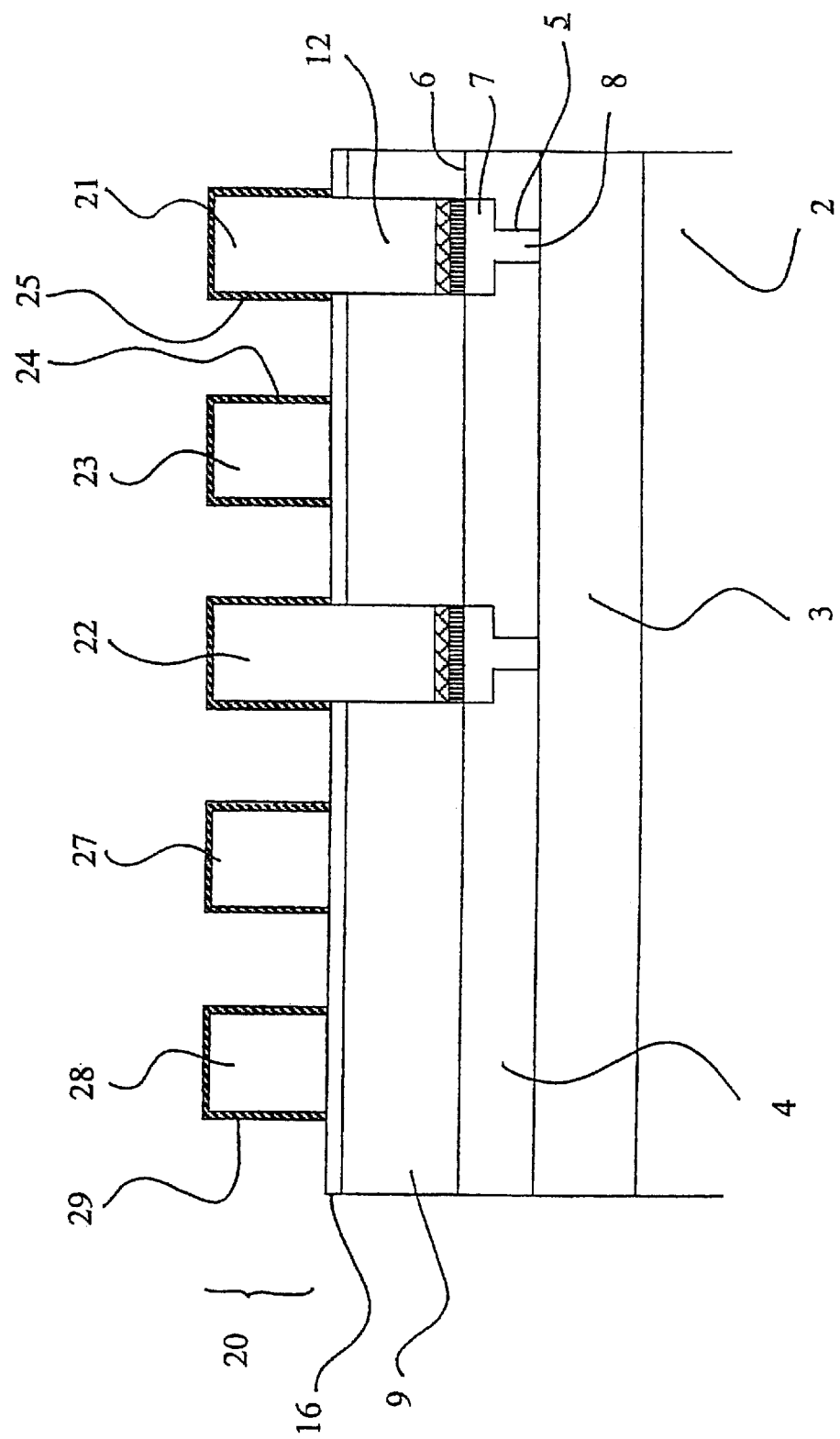
FIG. 1 is a schematic sectional view of an integrated circuit according to the invention, in the region in which the characteristic inductor is incorporated.

Thus, as illustrated in FIG. 1, the integrated circuit (1) comprises a substrate (2) made of semiconductor material, typically silicon or the like.

In its upper part, the semiconductor substrate (2) includes an active region (3) which has undergone various growth and doping steps allowing the integrated circuit to provide its electronic functions, as well as metal levels dedicated to wiring between the various transistors or electronic functions produced.

This semiconductor substrate (2) is covered with a passivation layer (4), typically consisting of an oxide-nitride alloy or of any other dielectric passivating material. This passivation layer (4) has a thickness of a few microns. Passing through this passivation layer is a plurality of metal contact pads (5), made of aluminum, which allow connection to the semiconductor substrate (2) from the upper face (6) of the passivation layer (4).

Thus, in practice, these contact pads (5) are flush with the upper face (6) of the passivation layer (4), occupying an area close to a square (7) having sides of a few tens of microns in length. These pads have a reduced cross section (8) at the region where they connect with the active region (3) of the semiconductor substrate (3).

According to the invention, in the embodiment illustrated in FIG. 1, the passivation layer (4) is covered with a polyimide layer (9).

The polyimide is used especially because of its low electrical permittivity, which limits the parasitic capacitance of the inductor according to the invention.

This polyimide layer (9) has a thickness of greater than 10 microns, preferably close to 30 microns.

Passing through the polyimide layer (9), vertically above the contact pads (5), are segments (12) having a cross section similar to that of the upper part (7) of the contact pads (5). These segments (12) are, according to the invention, made of copper.

These segments constitute the ends of the winding (20) which forms the inductor and which lies above a silica layer (16), said layer lying on the polyimide layer (9).

The winding (20) forms a spiral, the geometry of which may be polygonal, or preferably circular. Thus, the segments (12) connected to the contact pads (5) form downward extensions of the ends of the inductor (20) and typically of the end (21) of the outside turn and of the central end (22) of the spiral.

In practice, the copper turns (21–23) of the winding advantageously have a thickness of greater than 10 microns and preferably close to 30 microns.

These turns (21–23) have a rectangular cross section so as to present a plane surface opposite the adjacent turn. The space between two faces (24, 25) of adjacent turns is filled with air, thereby limiting the parasitic inter-turn capacitance.

In practice, the inter-turn distance is also advantageously close to 30 microns.

Given the risk of oxidation inherent when operating in a wet or chemically aggressive atmosphere, the copper turns are covered with a layer of gold (29) or of a gold-based alloy, with a thickness of about 1000 Å.

Figure 2:
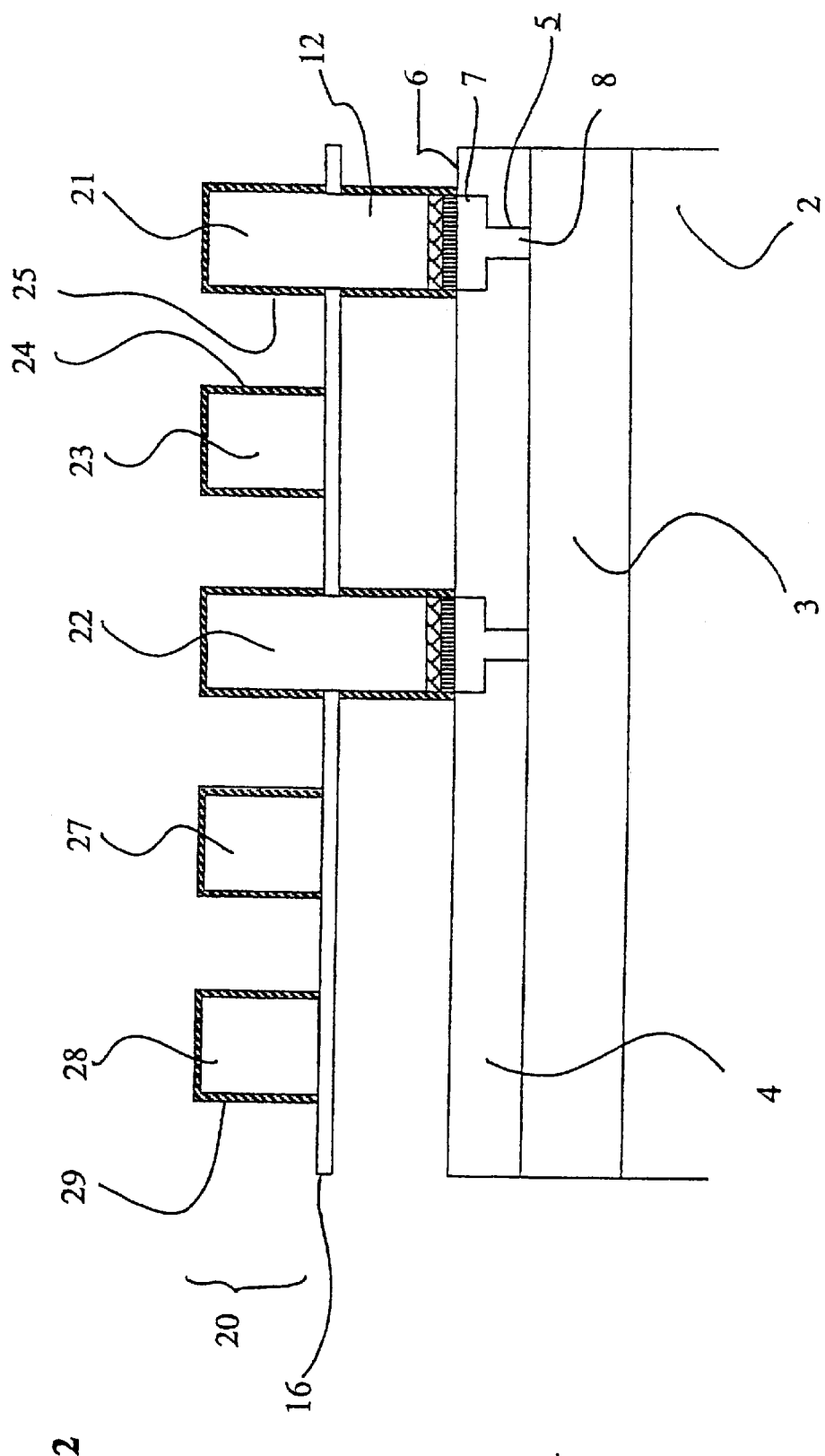
FIG. 2 is an identical sectional view illustrating an alternative embodiment.

In the alternative embodiment illustrated in FIG. 2, the space lying between the silica layer (16) and the passivation layer (4) is devoid of material, thereby limiting the value of the parasitic capacitance between the coil (20) and the ground plane, as well as the inter-turn capacitance (21–23).

Figure 3:
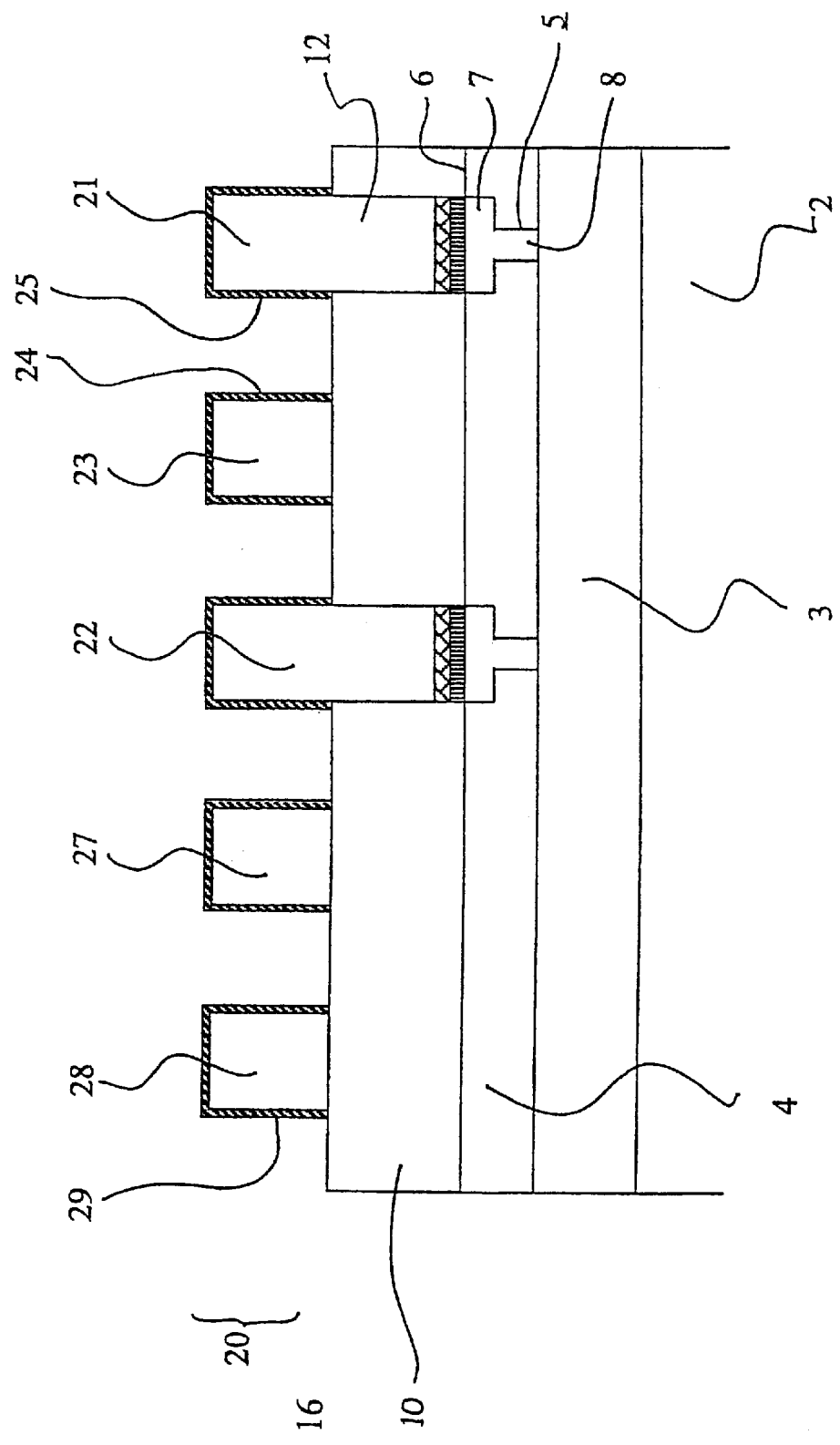
FIG. 3 is an identical sectional view illustrating another alternative embodiment.

In the embodiment illustrated in FIG. 3, the inductor (20) rests on a layer of benzocyclobutene (10). This layer of benzocyclobutene (10) rests directly on the upper face (6) of the passivation layer (4). Benzocyclobutene is chosen especially for its low electrical permittivity which limits the parasitic capacitances between the inductor (20) and the passivation layer (4), as well as for its good moisture resistance.

As already stated, the invention relates to a process for producing components such as those illustrated above.

Figure 4:
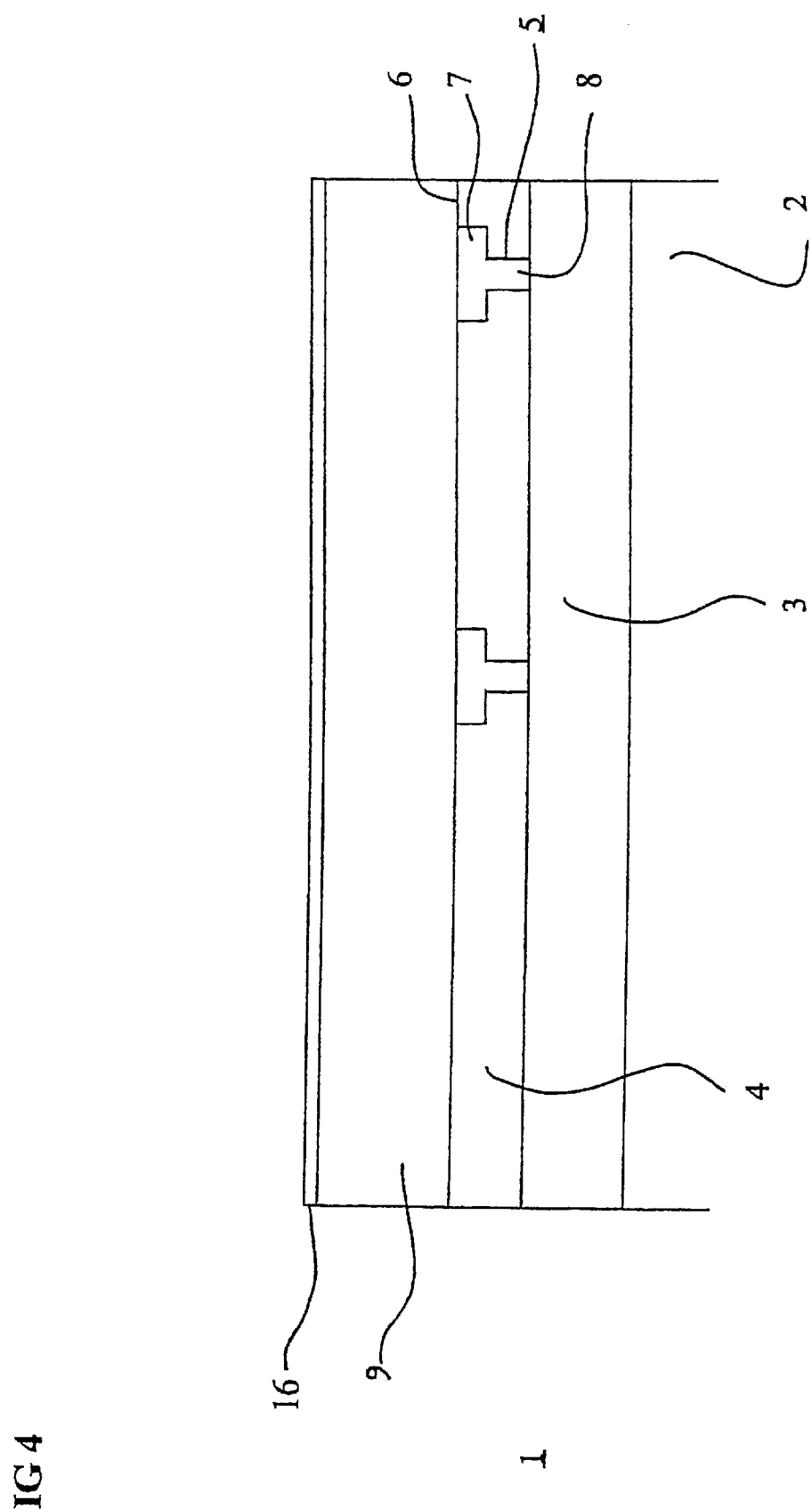
FIGS. 4 to 6 are identical sectional views illustrating various steps in the process according to the invention.

Thus, as illustrated in FIG. 4, the process is carried out on an integrated circuit comprising a layer of semiconductor substrate (2), on which layer the active layer (3) has formed and above which layer (2) has been deposited a passivation layer (4) made of an oxide-nitride alloy or any other dielectric passivating material.

Passing through this passivation layer (4) are metal pads (5) which, on the one hand, are connected to the semiconductor substrate (2) and, on the other hand, are flush with the upper face (6) of the passivation layer (4).

Thus, the first step of the process according to the invention consists in depositing a polyimide layer (9) on the passivation layer (4) of the entire wafer formed beforehand.

After the polyimide layer (9) has been deposited to a thickness of approximately 30 microns, a silica layer (16)

intended to ensure good bonding of the metal coatings to the upper face of the assembly is deposited.

According to another method of implementation, resulting in the circuit illustrated in FIG. 3, the passivation layer is covered with a layer of benzocyclobutene, chosen both for its low electrical permittivity, its planarizability and its ability to receive the metal coatings.

Thereafter, apertures (30) are created within the silica layer (16) and polyimide layer (9) so as to reveal the contact pads (5).

According to one characteristic of the invention, a nickel coating (31) is deposited over the entire assembly, and especially above the contact pads (5). This nickel (31) is intended to act as a barrier layer and to prevent migration of the copper, which will form the inductor, into the active region (3) of the semiconductor substrate (2).

According to another characteristic of the invention, a second metal layer (32) serving as a matching layer, and typically made of a nickel-gold or chromium-copper alloy, is deposited on the metal barrier layer (31).

Typically, the metal barrier layer has a thickness of about 2000 Å.

The function of this second metal layer (32) or matching layer is to limit the parasitic capacitances which appear at the metal junctions and to promote intermetallic adhesion.

Figure 5:
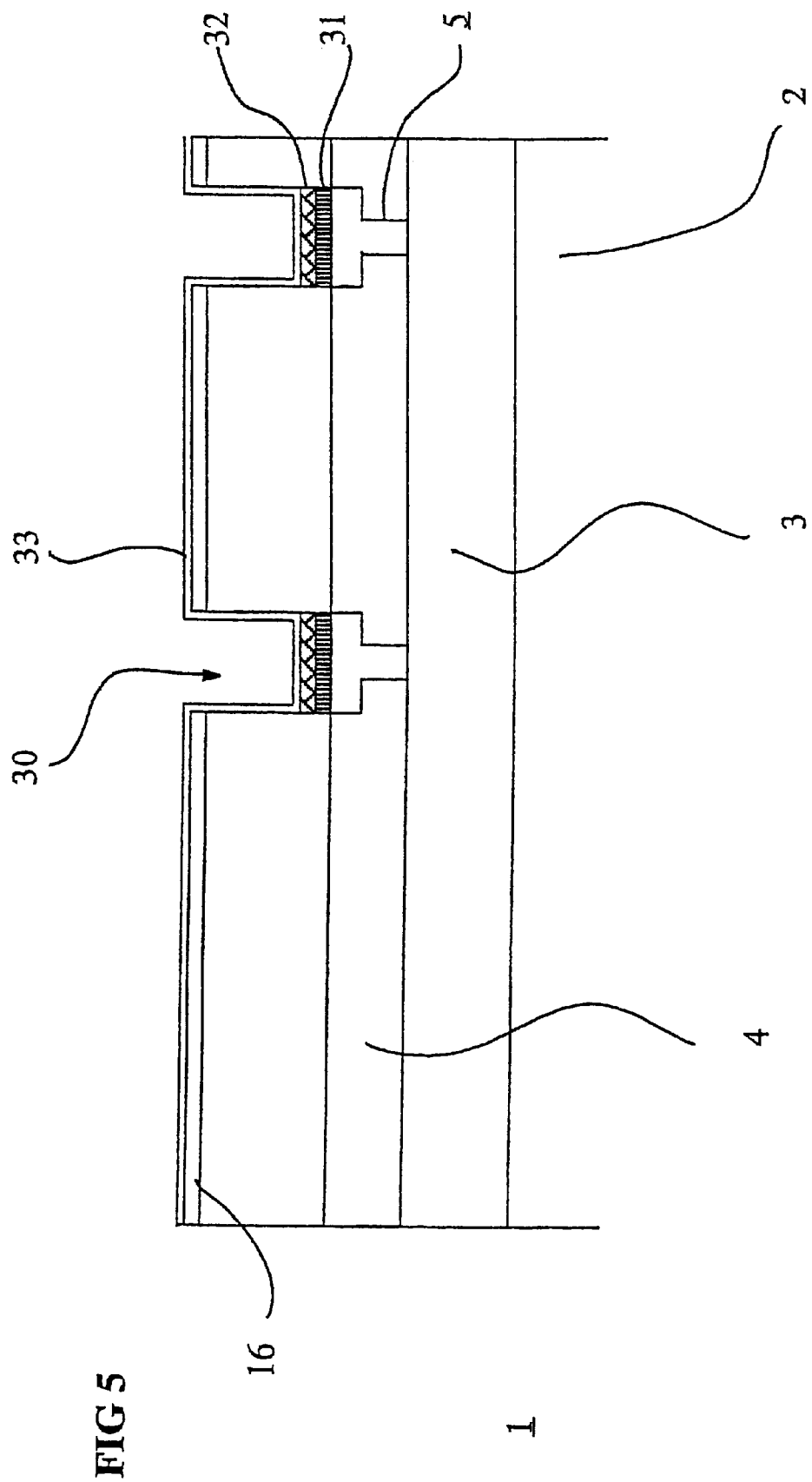

Next, according to the invention, a metal growth sublayer (33) is deposited over the entire assembly, in order to result in the form illustrated in FIG. 5.

This metal growth sublayer is made of a chromium-copper alloy and typically has a thickness of 2000 Å.

Next, a photosensitive resin is deposited on the metal growth sublayer (33). The resin is then exposed according to the desired circuit and to the geometry of the inductor.

Thus, depending on the mask chosen, the resin is then developed in the form of lines which will form the winding.

Next, copper (35) is deposited by electrolytic growth from the regions in which the metal growth sublayer is exposed.

Copper is deposited on the silica planarization layer (16) in order to form the segments (23, 27, 28) forming the main part of the inductor. Copper electroplating also takes place above the barrier layer (31) and matching layer (32) which have been deposited on the contact pads (5).

The side walls of the resin have a height such that they channel the growth of the copper, guaranteeing verticality of the opposing faces (24, 25) of adjacent turns.

Figure 6:
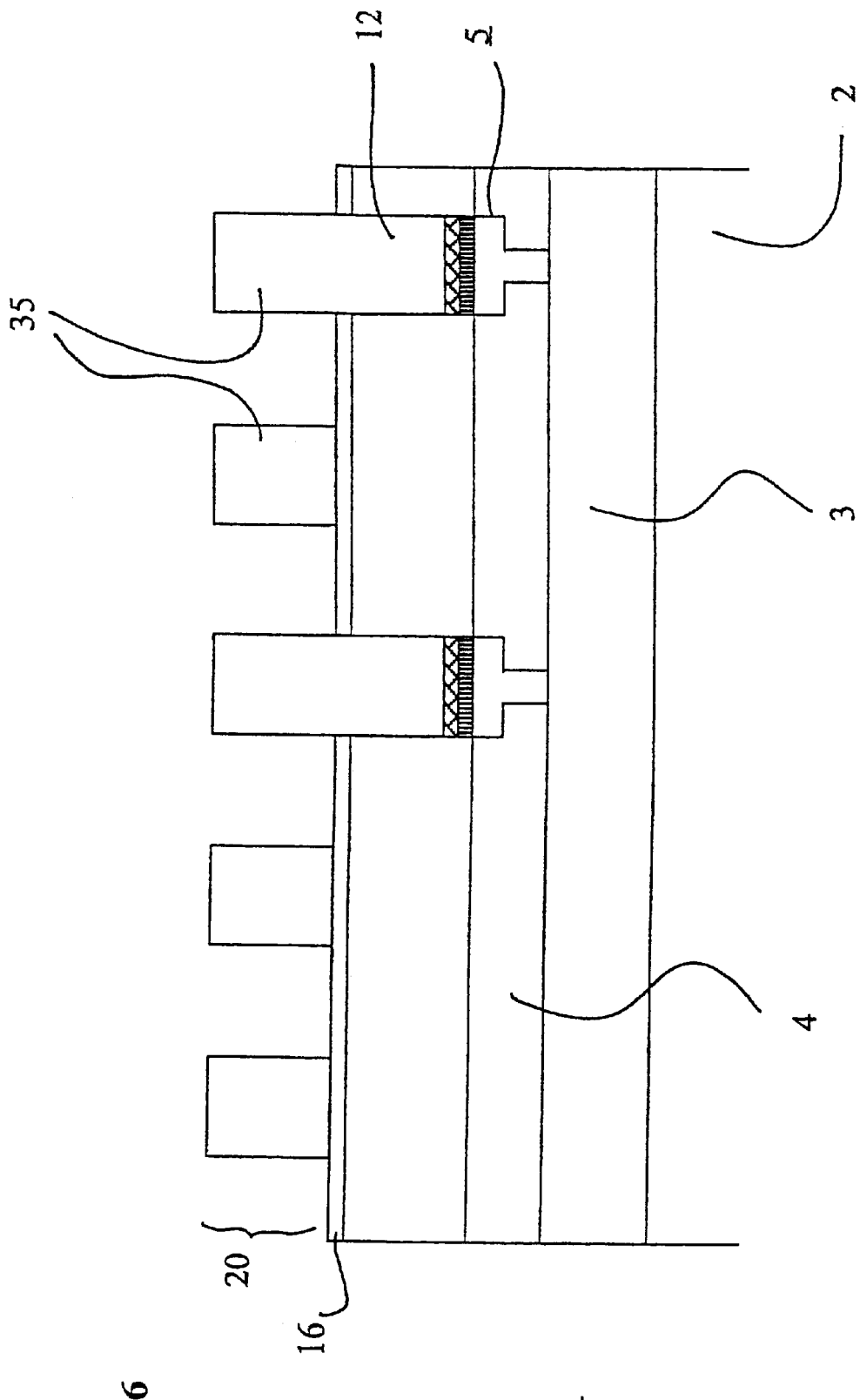

When the electroplated copper turns (21–23, 27, 28) reach the desired height, i.e. approximately 30 microns, the remaining resin is then removed together with the metal growth sublayer which was protected by the said resin, in order to result in the state illustrated in FIG. 6.

Figure 7:
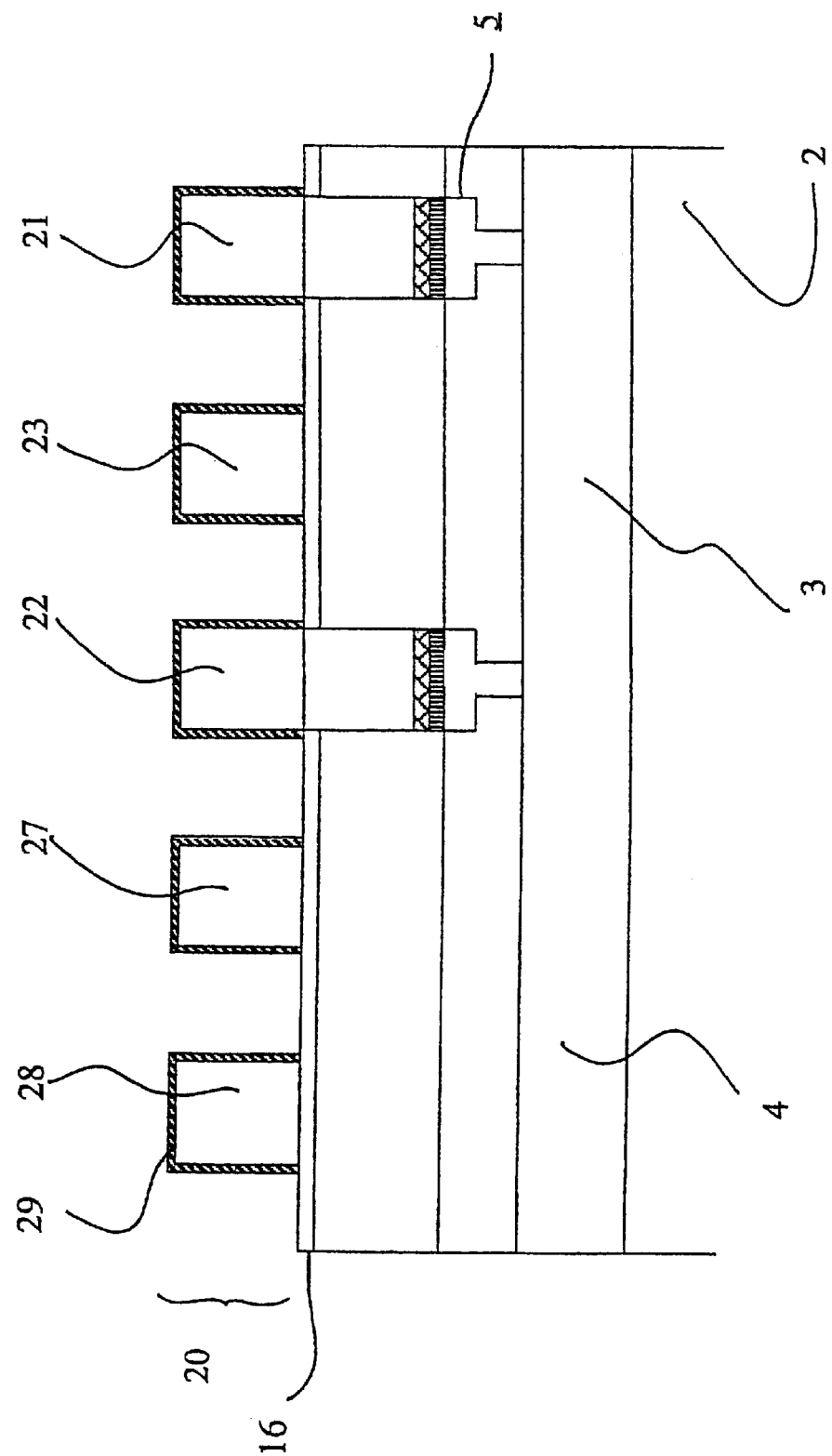

Thereafter, as illustrated in FIG. 7, a layer of gold (29), typically with a thickness of 1000 Å, is deposited on the copper turns (21–23, 27, 28) and more specifically on all those faces of these turns which are intended to come into contact with the external environment.

Deposition of this layer (29) of gold or gold-based alloy makes it possible to eliminate any risk of copper oxidation which would degrade the electrical performance of the inductor.

Thus, the inductor as illustrated in FIG. 7, corresponding approximately to the inductor in FIG. 1, is obtained.

In an alternative method of implementation illustrated in FIG. 8, the process according to the invention has an additional step intended for removing the polyimide layer lying between the silica planarization layer (16) and the passivation layer (4). This step makes it possible to remove any material present between the inductor (20) and the integrated circuit proper, thereby improving the electrical properties by greatly reducing the values of the parasitic capacitances, both between the inductor and ground and between the turns of the inductor itself.

In the situation illustrated in FIG. 8, the step of passivating the copper by depositing a layer of gold takes place after the polyimide has been removed so that the segments (12) of the inductor forming the ends of the coil are also covered with this protective layer of gold (40).

Of course, the invention also covers the alternative embodiments of the integrated circuit incorporating transformers consisting of several windings wound in a mutually imbricated fashion.

It is apparent from the foregoing that the integrated circuit according to the invention makes it possible to obtain electrical circuits incorporating inductors which are capable of operating at high frequencies, greater than several gigahertz, and having a Q-factor substantially greater than the existing circuits, typically by a factor of ten, throughout the frequency range.

The incorporation of the inductor directly above the passivation layer of the integrated circuit, in a single step, makes it possible to increase the compactness of the assembly without the need to provide an inactive region on the integrated circuit.

The process according to the invention makes it possible to fabricate integrated circuits comprising inductive components without requiring extensive modifications of the fabrication process since the inductors or the inductive components are produced directly after the process for fabricating the integrated circuit itself.

No step of incorporating inductive components produced elsewhere is therefore necessary, thereby eliminating any transfer operation which it is known is of limited precision and which, in any case, would result in degradation of the mechanical properties due to the soldered or brazed joint regions.

Such a process is furthermore carried out at a temperature below 400° C., which avoids the risk of the active layer of the substrate being degraded.

Industrial Applications

The integrated circuits according to the invention have many applications, especially in all circuits which include oscillators, amplifiers or mixers, as well as in any active or passive filter.

The combination with integrated circuits is most particularly applicable in electronic systems intended for processing in telecommunication, microwave and radiofrequency applications.

What is claimed is:

1. A process for fabricating a monolithic integrated circuit incorporating an inductive component, which comprises the following steps in which:

a polyimide layer (9) is deposited on a semiconductor substrate (2) covered with a passivation layer (4) and comprising metal pads (5) connected to the substrate (2) and passing through the passivation layer (4) in order to be flush with the upper face (6) of said layer (4);

a silica layer (16) is deposited on said polyimide layer (9);

apertures (30) are made in the silica layer (16) and the polyimide layer (9), said apertures (30) emerging at the metal pads (5);

a metal growth sublayer (33) is deposited on the assembly;

a layer of photosensitive resin is deposited on the metal growth sublayer (33);

the resin is exposed and the regions intended to form the lower face of the inductive component (20) are removed;

a copper layer intended to form the strip of the inductive component is electrolytically deposited on the visible regions of the metal growth sublayer;

the rest of the photosensitive resin and the rest of the metal growth sublayer are removed.

2. The process as claimed in claim 1, which furthermore includes a step of removing the polyimide layer (9).

3. The process as claimed in claim 1, which furthermore includes a step of passivating the copper strip by depositing a layer (28, 40) of gold or gold-based alloy.

4. The process as claimed in claim 1, which includes a step of depositing a metal forming a barrier layer (31) on the metal pad.

5. The process as claimed in claim 4, which includes a step of depositing a matching layer (32) on the metal barrier layer (31).

6. A process for fabricating a monolithic integrated circuit incorporating an inductive component, which comprises the following steps in which:

a benzocyclobutene layer (9) is deposited on a semiconductor substrate (2) covered with a passivation layer (4) and comprising metal pads (5) connected to the substrate (2) and passing through the passivation layer (4) in order to be flush with the upper face (6) of said layer (4);

apertures (30) are made in the benzocyclobutene layer (9), said apertures (30) emerging at the metal pads (5);

a metal growth sublayer (33) is deposited on the assembly;

a layer of photosensitive resin is deposited on the metal growth sublayer (33);

the resin is exposed and the regions intended to form the lower face of the inductive component (20) are removed;

a copper layer intended to form the strip of the inductive component is electrolytically deposited on the visible regions of the metal growth sublayer;

the rest of the photosensitive resin and the rest of the metal growth sublayer are removed.

\* \* \* \* \*